(12) United States Patent
Liu et al.

(10) Patent No.: US 8,221,547 B2
(45) Date of Patent: Jul. 17, 2012

(54) NITRIDE SEMICONDUCTOR SUBSTRATE AND METHOD FOR FORMING THE SAME

(75) Inventors: Po-Chun Liu, Taichung County (TW); Yih-Der Guo, Hsinchu (TW); Tung-Wei Chi, Taichung County (TW); Chu-Li Chao, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1029 days.

(21) Appl. No.: 12/177,167

(22) Filed: Jul. 22, 2008

(65) Prior Publication Data

US 2009/0274883 A1    Nov. 5, 2009

(30) Foreign Application Priority Data

May 2, 2008   (TW) ............................... 97116197 A

(51) Int. Cl.
*B32B 3/10* (2006.01)
*C30B 25/04* (2006.01)

(52) U.S. Cl. ..................... 117/95; 428/201; 428/195.1

(58) Field of Classification Search ............... 428/195.1; 117/95

See application file for complete search history.

(56) References Cited

U.S. PATENT DOCUMENTS

| | | |
|---|---|---|
| 6,380,108 B1 | 4/2002 | Linthicum et al. |
| 6,861,729 B2 | 3/2005 | Kozaki et al. |
| 6,940,098 B1 | 9/2005 | Tadatomo et al. |

OTHER PUBLICATIONS

Zang et al., "Nanoscale lateral epitaxial overgrowth of GaN on Si (111)," Applied Physics Letters, 87, 193106 (2005).*

* cited by examiner

*Primary Examiner* — Mark Ruthkosky
*Assistant Examiner* — Ian Rummel
(74) *Attorney, Agent, or Firm* — Jianq Chyun IP Office

(57) ABSTRACT

An initial substrate structure for forming a nitride semiconductor substrate is provided. The initial substrate structure includes a substrate, a patterned epitaxial layer, and a mask layer. The patterned epitaxial layer is located on the substrate and is formed by a plurality of pillars. The mask layer is located over the substrate and covers a part of the patterned epitaxial layer. The mask layer includes a plurality of sticks and there is a space between the sticks. The space exposes a portion of an upper surface of the patterned epitaxial layer.

14 Claims, 4 Drawing Sheets

NITRIDE SEMICONDUCTOR SUBSTRATE AND METHOD FOR FORMING THE SAME

CROSS-REFERENCE TO RELATED APPLICATION

This application claims the priority benefit of Taiwan application serial no. 97116197, filed on May 2, 2008. The entirety of the above-mentioned patent application is hereby incorporated by reference herein and made a part of specification.

BACKGROUND OF THE INVENTION

1. Field of the Invention

The present invention generally relates to a method for forming a Group III-V semiconductor layer, in particular, to a nitride semiconductor layer and a forming method thereof.

2. Description of Related Art

Recently, light-emitting diodes (LED) and laser diodes (LD) have been widely applied to the market. For example, a white light can be obtained by combining a blue fluorescent powder with a yellow fluorescent powder manufactured by GaN, which is not only brighter and more power-saving than that of the conventional bulb, but also greatly reduces the power consumption. In addition, the service life of the LED is approximately over several ten thousand hours, which is much longer than that of the conventional bulb.

During the process of manufacturing the GaN semiconductor light emitting device, a GaN semiconductor layer and a heterogeneous substrate have difference lattice constants and thermal expansion coefficients, so the penetration dislocation and thermal stress problems easily occurs for the GaN semiconductor during the epitaxy process, so as to seriously affect a light emitting efficiency of the light emitting device. Then, the poor thermal conductivity of the heterogeneous substrate also be a main factor that would decay devices efficiency.

Conventionally, the process for separating the GaN semiconductor layer from the heterogeneous substrate includes a light irradiation manner, in which the laser light penetrates the substrate and irradiates an interface between the substrate and the GaN semiconductor layer, so as to separate the GaN semiconductor layer from the heterogeneous substrate. In addition, it is also possible to directly remove the barrier structure between the substrate and the GaN semiconductor layer through wet etching, so as to weaken the connection structure between the GaN semiconductor layer and the heterogeneous substrate, thereby separating the GaN semiconductor layer from the heterogeneous substrate. In addition, an interface layer between the GaN semiconductor layer and the heterogeneous substrate may be directly removed by performing a vapour phase etching (VPE) under high temperature, so as to separate the GaN semiconductor layer from the heterogeneous substrate.

However, all the above methods cannot modify the deterioration of the light emitting efficiency of the GaN semiconductor layer resulted from both the penetration dislocation and thermal stress during the epitaxy process at the same time.

SUMMARY OF THE INVENTION

Accordingly, the present invention is directed to an initial substrate structure, in which a patterned epitaxial layer of the initial substrate structure includes pillars, and an occasion for separating a nitride semiconductor layer from a substrate is controlled through sticks on the pillars.

The present invention is further directed to a transitional structure, in which an epitaxial growth layer between a patterned epitaxial layer and a nitride semiconductor layer in the transitional structure is used to adjust the structure strength between the nitride semiconductor layer and the substrate, so as to achieve an objective of separating the nitride semiconductor layer from the substrate.

The present invention is further directed to a method for forming a nitride semiconductor layer, in which through a pore mask layer having nano pores, an epitaxial growth layer in the mode of selectively growth is formed on the patterned epitaxial layer, so as to provide a weakening structure required for forming the nitride semiconductor layer.

The present invention provides an initial substrate structure, applicable for forming a nitride semiconductor substrate. The initial substrate includes a substrate, a patterned epitaxial layer, and a mask layer. The patterned epitaxial layer is located on substrate, and is formed by a plurality of pillars. The mask layer is located over the substrate and covers a part of the patterned epitaxial layer, in which the mask layer has a plurality of sticks, and there is a space between the sticks. The space exposes a portion of an upper surface of the patterned epitaxial layer.

The present invention further provides a transitional structure, applicable for forming a nitride semiconductor substrate. The transitional structure includes a substrate, a patterned epitaxial layer, a mask layer, and a nitride semiconductor layer. The patterned epitaxial layer is located on the substrate, and is formed by a plurality of pillars. The mask layer is located over the substrate and covers a part of the patterned epitaxial layer, in which the mask layer has a plurality of sticks, and there is a space between the sticks for exposing an upper surface of the pillars. The space is filled up with an epitaxial growth layer extending from the patterned epitaxial layer. In addition, the nitride semiconductor layer is located over the substrate, and is connected to the patterned epitaxial layer through the epitaxial growth layer between the sticks.

The present invention further provides a method for forming a nitride semiconductor layer, which includes the following steps. First, a substrate is provided, and then a patterned epitaxial layer is formed on the substrate, in which the patterned epitaxial layer is formed by a plurality of pillars. Then, a mask layer is formed on the patterned epitaxial layer. Then, a pore mask layer is formed on the mask layer, in which the pore mask layer has a plurality of pores, and each pore exposes a part of an upper surface of the mask layer. Then, the mask layer is patterned to form a patterned mask layer by taking the pore mask layer as a mask, in which the patterned mask layer has a plurality of sticks, and the patterned mask layer exposes a portion of an upper surface of the patterned epitaxial layer. Then, the pore mask layer is removed. Then, an epitaxy process is performed, to form an epitaxial growth layer between the sticks of the patterned mask layer, and to form a nitride semiconductor layer over the patterned epitaxial layer, in which the nitride semiconductor layer is connected to the patterned epitaxial layer through the epitaxial growth layer. Then, a weakening process is performed, to separate the nitride semiconductor layer from the substrate by taking the epitaxial growth layer as a separation point.

In the present invention, there is a patterned mask layer between the nitride semiconductor layer and the substrate, the patterned mask layer is configured with stick structures, and the nano spaces between the sticks are filled up with the epitaxial growth layer, so that the epitaxial growth layer with the nano size has become a weakening structure between the nitride semiconductor layer and the substrate. If the degrade structure cannot bear the stress change between the nitride semiconductor layer, the sticks of the patterned mask layer, and the epitaxial growth layer and is broken, the nitride semiconductor layer is separated from the substrate, thereby obtaining a high-quality nitride layer substrate.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
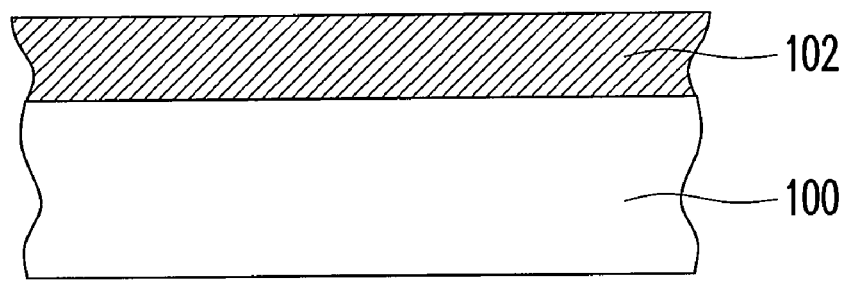
FIGS. 1A to 1G show a method for forming a nitride semiconductor layer according to an embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1G show a method for forming a nitride semiconductor layer according to an embodiment of the present invention. Referring to FIG. 1A, firstly, a substrate 100 is provided. A material of the substrate 100 is one selected from a group consisting of silicon, silicon carbide, sapphire, arsenide, phosphide, zinc oxide, and magnesium oxide. Next, an epitaxial layer 102 is formed on the substrate 100, in which a material of the epitaxial layer 102 includes indium, aluminum, or gallium containing nitride semiconductor.

Figure 1B:
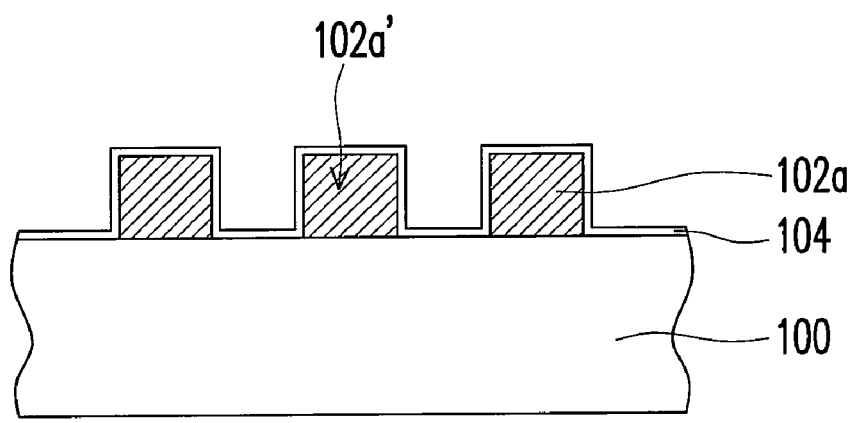

Referring to FIG. 1B, a patterning process is performed, to pattern the epitaxial layer 102 into a patterned epitaxial layer 102a formed by a plurality of pillars 102a'. In addition, the cross section of the pillars 102a' includes a spot shape or a strip shape. Furthermore, a ratio of a height of each pillar 102a' to a spacing distance between the pillars 102a' is approximately 1:5-1:10. Then, a mask layer 104 is formed over the substrate 100, and covers the pillars 102a' of the patterned epitaxial layer 102a. The mask layer 104 is made of, for example, silicon nitride, silica, and spin-on glass. In addition, the thickness of the mask layer 104 is approximately 100 nm-500 nm.

Figure 1C:
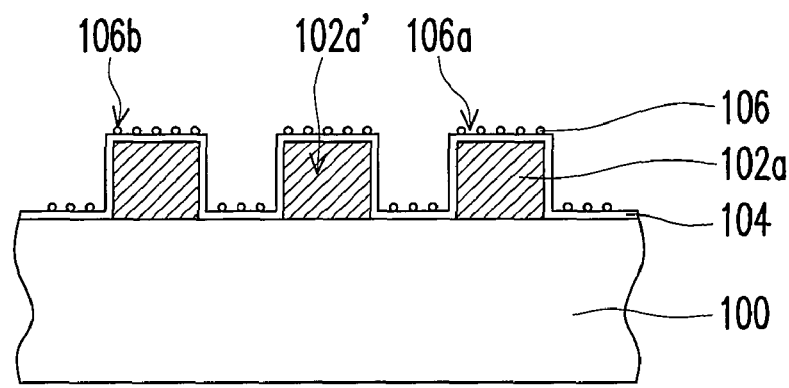

Referring to FIG. 1C, a pore mask layer 106 is formed on the mask layer 104. The pore mask layer 106 has a plurality of pores 106a, and each pore 106a exposes a portion of an upper surface of the mask layer 104. The pore mask layer 106 is formed through the following steps. First, a material layer (not shown) is formed over the substrate 100, and then, a nano-structure process is performed on the material layer, such that the material layer is converted to the pore mask layer 106 having pores. The material layer is made of, for example, nickel, cobalt, and iron. The nano-structure process includes an etching process or a high temperature process. The temperature for the high temperature process is, for example, 850° C. In addition, the pore mask layer 106 is formed by, for example, a plurality of adjacent or non-adjacent material particles 106b, and each material particle 106b has a diameter of approximately 100 nm-200 nm, and the size of the pore 106a between each two material particles 106b is approximately 50 nm-100 nm, that is, the distance between each two material particles 106b is approximately 50 nm-100 nm. In an embodiment of the present invention, the material layer and the mask layer have different individual surface tensions. Thus, through the difference between the surface tensions of the heterogeneous materials, and the temperature for forming the material layer, the nano material particles are controlled to be automatically gathered and formed on the material layer when the material layer is formed on the mask layer, and the nano pores for exposing the upper surface of the mask layer 104 are formed as well.

Figure 1D:
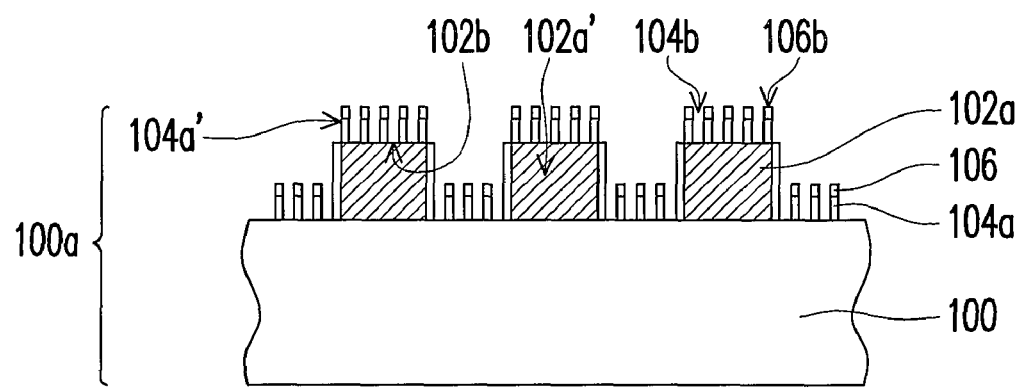

Referring to FIG. 1D, by taking the pore mask layer 106 as a mask, the part of the mask layer 104 exposed by the pore mask layer 106 is removed, and the mask layer 104 is patterned into a patterned mask layer 104a. The patterned mask layer 104a has a plurality of sticks 104a', and there is a space 104b between the sticks 104a' for exposing an upper surface 102b of the patterned epitaxial layer 102a. In addition, the distance between each two sticks 104a' is approximately 50 nm-100 nm. Furthermore, a diameter of each stick 104a' is smaller than that of each pillar 102a'.

Figure 1E:
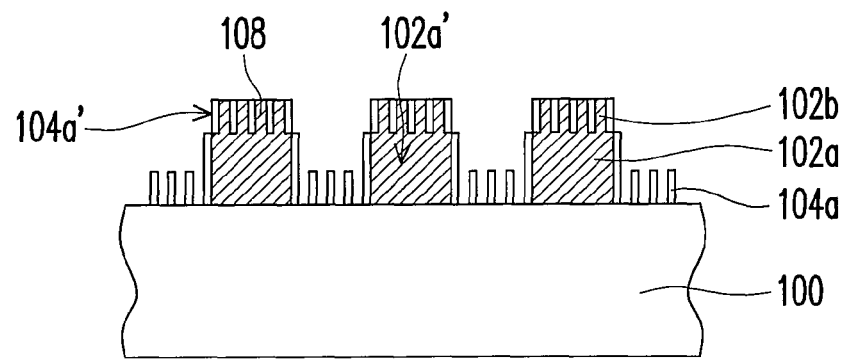
Figure 1F:
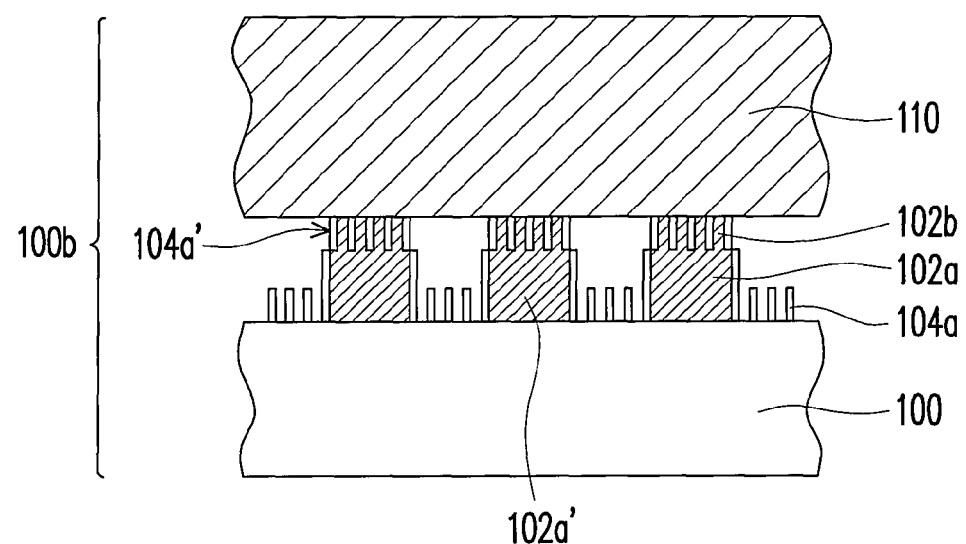

Referring to FIGS. 1E and 1F, the pore mask layer 106 is then removed. After the pore mask layer 106 is removed, the substrate 100 having the patterned epitaxial layer 102a and the patterned mask layer 104a may be considered as an initial substrate structure 100a for forming the nitride semiconductor layer subsequently. Then, an epitaxy process is performed, to form an epitaxial growth layer 108 between the sticks of the patterned mask layer, and to further form a nitride semiconductor layer 110 over the substrate 100. At this time, the structure for connecting the nitride semiconductor layer 110 with the substrate 100 through the epitaxial growth layer 108 may be considered as a transitional structure 100b. During the epitaxy process, on the upper surface 102b of the patterned epitaxial layer 102a exposed by the spaces 104b between the sticks 104a' of the patterned mask layer 104a, the epitaxial growth layer 108 is selectively grown and fills up the spaces 104. The epitaxy process is, for example, a hydride vapor phase epitaxy (HVPE) or a metal organic vapor phase epitaxy (MOVPE). The nitride semiconductor layer is, for example, a GaN semiconductor layer. It should be noted that, the nitride semiconductor layer 110 is connected to the patterned epitaxial layer 102a through the epitaxial growth layer 108 between the sticks 104a' of the patterned mask layer 104a on the pillars 102a'. In other words, during the epitaxy process, the upper surface 102b of the pillars 102a' exposed by the patterned mask layer 104a provides an epitaxy environment, i.e., a nucleation surface, such that the epitaxial growth layer 108 grows upwards on the upper surface 102b, thereby forming the nitride semiconductor layer 110.

Figure 1G:
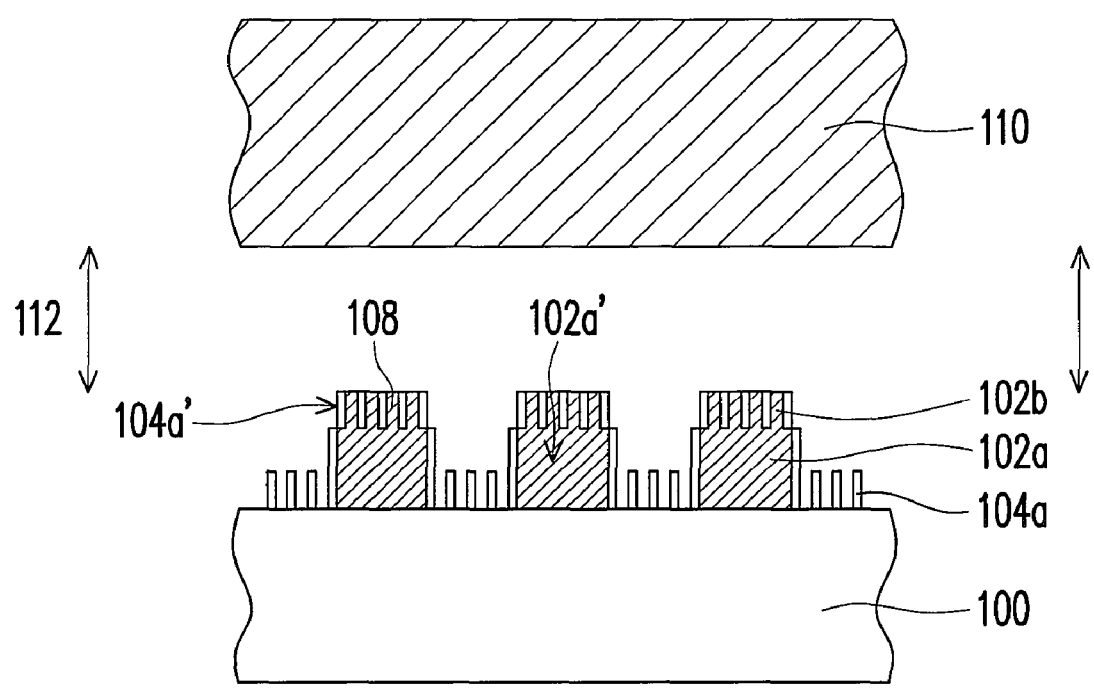

Referring to FIG. 1G, a weakening process 112 is performed, to separate the nitride semiconductor layer 110 from the substrate 100 by taking the epitaxial growth layer 108 as a separation point. The above weakening process 112 is, for example, a cooling step, in which since the nitride semiconductor layer 110 and the sticks 104a' of the patterned mask layer 104a have different thermal expansion coefficients, the stress changes are generated while the temperature less than growth temperature, and accordingly the structure weakening is generated between the nitride semiconductor layer 110 and the epitaxial growth layer 108 for separating the nitride semiconductor layer 110 from the epitaxial growth layer 108.

To sum up, in the present invention, there is a patterned epitaxial layer between the nitride semiconductor layer and the substrate, the epitaxial layer has a pillar, and a mask layer is formed on the pillar. Through utilizing the material characteristics of the heterogeneous materials, a pore mask layer having nano pores is formed on the pillar, and then by taking the pore mask layer as a mask, the mask layer is patterned, so as to form sticks with the nano size on the mask layer. Then, the pillar and the nitride semiconductor layer are connected through an epitaxial growth layer for filling up the nano spaces of the patterned mask layer on the pillar. The space of the patterned mask layer has the nano size, so that the epitaxial growth layer for connecting the nitride semiconductor layer with the pillar of the patterned epitaxial layer also has the nano size, thereby a weakening structure is formed between the nitride semiconductor layer and the substrate. Therefore, during the weakening process, when the contact between the nitride semiconductor layer and the epitaxial growth layer cannot bear the stress change and is broken, the nitride semiconductor layer is separated from the substrate, thereby obtaining a high quality nitride semiconductor substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An initial substrate structure, applicable for forming a nitride semiconductor substrate, comprising:
   a substrate;
   a patterned epitaxial layer, located on the substrate, wherein the patterned epitaxial layer is formed by a plurality of pillars; and
   a mask layer, located over the substrate and covering a part of the patterned epitaxial layer, wherein the mask layer comprises a plurality of sticks, there is a space between the sticks, and the space exposes a portion of an upper surface of the patterned epitaxial layer and exposes a portion of an upper surface of the substrate.

2. The initial substrate structure according to claim 1, wherein a material of the substrate is one selected from a group consisting of silicon, silicon carbide, sapphire, arsenide, phosphide, zinc oxide, and magnesium oxide.

3. The initial substrate structure according to claim 1, wherein a material of the mask layer comprises silicon nitride, silica, and spin-on glass.

4. The initial substrate structure according to claim 1, wherein a thickness of the mask layer is approximately 100 nm-500 nm.

5. The initial substrate structure according to claim 1, wherein a distance between the sticks is approximately 50 nm-100 nm.

6. The initial substrate structure according to claim 1, wherein a first diameter of each stick is smaller than a second diameter of each pillar.

7. The initial substrate structure according to claim 1, wherein a ratio of a height of each pillar to a spacing distance between the pillars is approximately 1:5-1:10.

8. A transitional structure, applicable for forming a nitride semiconductor substrate, comprising:
   a substrate;
   a patterned epitaxial layer, located on the substrate, wherein the patterned epitaxial layer is formed by a plurality of pillars;
   a mask layer, located over the substrate and covering a part of the patterned epitaxial layer, wherein the mask layer comprises a plurality of sticks, there are spaces between the sticks for exposing an upper surface of the pillars and exposing a portion of an upper surface of the substrate, and a portion of the spaces exposing the upper surface of the pillars are filled up with an epitaxial growth layer extending from the patterned epitaxial layer; and
   a nitride semiconductor layer, located over the substrate, and connected to the patterned epitaxial layer through the epitaxial growth layer between the sticks.

9. The transitional structure according to claim 8, wherein a material of the substrate is one selected from a group consisting of silicon, silicon carbide, sapphire, arsenide, phosphide, zinc oxide, and magnesium oxide.

10. The transitional structure according to claim 8, wherein a material of the mask layer comprises silicon nitride, silica, and spin-on glass.

11. The transitional structure according to claim 8, wherein a thickness of the mask layer is approximately 100 nm-500 nm.

12. The transitional structure according to claim 8, wherein a distance between the sticks is approximately 50 nm-100 nm.

13. The transitional structure according to claim 8, wherein a first diameter of each stick is smaller than a second diameter of each pillar.

14. The transitional structure according to claim 8, wherein a ratio of a height of each pillar to a spacing distance between the pillars is approximately 1:5-1:10.

* * * * *